(12) United States Patent
Gulaka et al.

(10) Patent No.: US 8,878,535 B2
(45) Date of Patent: Nov. 4, 2014

(54) METHOD AND APPARATUS FOR CAPTURING MAGNETIC RESONANCE IMAGE

(71) Applicant: Samsung Electronics Co., Ltd., Suwon-si (KR)

(72) Inventors: Praveen Gulaka, Suwon-si (KR); Sang-cheon Choi, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/846,206

(22) Filed: Mar. 18, 2013

(65) Prior Publication Data

US 2014/0145718 A1     May 29, 2014

(30) Foreign Application Priority Data

Nov. 23, 2012 (KR) ........................ 10-2012-0133941

(51) Int. Cl.
*G01V 3/00* (2006.01)
*G01R 33/48* (2006.01)
*G01R 33/561* (2006.01)
*G01R 33/565* (2006.01)

(52) U.S. Cl.
CPC .......... *G01R 33/561* (2013.01); *G01R 33/4824* (2013.01); *G01R 33/56509* (2013.01); *G01R 33/4826* (2013.01)
USPC .......................................... 324/309; 324/307

(58) Field of Classification Search
USPC ........... 324/309, 307, 306, 312, 314; 600/410
See application file for complete search history.

(56) References Cited

U.S. PATENT DOCUMENTS

| | | | |
|---|---|---|---|
| 6,577,127 B2 * | 6/2003 | Harvey et al. ................. | 324/307 |
| 6,882,148 B2 | 4/2005 | Pipe | |
| 7,102,348 B2 | 9/2006 | Zhang et al. | |
| 7,176,684 B2 | 2/2007 | Patch et al. | |
| 7,285,955 B2 * | 10/2007 | Roberts et al. ................ | 324/309 |
| 7,336,073 B2 | 2/2008 | Patch et al. | |
| 7,535,222 B2 | 5/2009 | Bammer et al. | |
| 7,786,728 B2 | 8/2010 | Fukuta | |
| 7,840,049 B2 | 11/2010 | Stemmer | |
| 8,073,523 B2 * | 12/2011 | Moghaddam et al. ........ | 600/410 |
| 8,222,900 B2 * | 7/2012 | Wilson et al. ................. | 324/309 |
| 2001/0033162 A1 | 10/2001 | Harvey et al. | |
| 2001/0043069 A1 | 11/2001 | Nehrke et al. | |
| 2006/0238193 A1 | 10/2006 | Roberts et al. | |
| 2007/0182411 A1 | 8/2007 | Bammer et al. | |
| 2008/0021303 A1 | 1/2008 | Krueger | |
| 2010/0117645 A1 | 5/2010 | Eggers et al. | |
| 2010/0305424 A1 | 12/2010 | Cook et al. | |
| 2012/0243756 A1 | 9/2012 | Samsonov et al. | |

OTHER PUBLICATIONS

Communication dated Jul. 18, 2013 issued by the European Patent Office in counterpart Application No. 13162153.4.

(Continued)

*Primary Examiner* — Louis Arana
(74) *Attorney, Agent, or Firm* — Sughrue Mion, PLLC

(57) ABSTRACT

When an RF pulse sequence is applied to obtain an MR signal, a pulse sequence and a blade pulse sequence that pass a center of a k-space are applied, and thus an over-sampling at the center of a k-space in a short scanning time may be enabled. Therefore, a method for capturing an MR image that is robust against a motion artifact includes applying a radio frequency (RF) pulse sequence; obtaining an MR signal in response to the applied RF pulse sequence; and generating an MR image from the obtained MR signal.

28 Claims, 8 Drawing Sheets

(56) References Cited

OTHER PUBLICATIONS

International Search Report (PCT/ISA/210) dated Sep. 26, 2013 issued by the International Searching Authority in counterpart Application No. PCT/KR2013/004481.
Written Opinion (PCT/ISA/237) dated Sep. 26, 2013 issued by the International Searching Authority in counterpart Application No. PCT/KR2013/004481.
Irarrazabal P. et al. : "Fast Three Dimensional Magnetic Resonance Imaging", vol. 33, No. 5, May 1, 1995, p. 656-662, XP000620368.
M. Fu et al. :"High-Frame-Rate Multislice Speech Imaging with Sparse Samping of (k,t)-space", Apr. 21, 2012, XP55070652; 1 page total.
R.W. Schaffer et al. : "Spiral Steady State Free Precession Imaging with the Diminishing Variance Algorithm for High Resolution Coronary Artery Imaging", Jun. 26, 2003, p. 941, XP055070650.
Sachs T Et Al. : "Real-Time Motion Detection in Spiral MRI using Navigators", vol. 32, No. 5, Nov. 1, 1994, pp. 639-645, XP000479921.
Communication dated Nov. 27, 2013 from the Korean Intellectual Property Office in a counterpart application No. 10-2012-0133941.

* cited by examiner

PROPELLER FOR 2D K-SPACE

EPI-ONE SHOT

EPI-ONE SHOT

FSE

PARALLEL IMAGING

METHOD AND APPARATUS FOR CAPTURING MAGNETIC RESONANCE IMAGE

CROSS-REFERENCE TO RELATED PATENT APPLICATION

This application claims the priority from Korean Patent Application No. 10-2012-0133941, filed on Nov. 23, 2012, in the Korean Intellectual Property Office, the disclosure of which is incorporated herein in its entirety by reference.

BACKGROUND

1. Field

Apparatuses and methods consistent with exemplary embodiments relate to capturing a magnetic resonance (MR) image, by which dense data may be obtained at a center of a k-space.

2. Description of the Related Art

Magnetic resonance imaging (MRI) forms an image based on information obtained by resonance after exposure of an atomic nucleus to a magnetic field. Resonance of the atomic nucleus is a phenomenon in which if a particular high frequency energy is incident into the atomic nucleus magnetized by an external magnetic field, the atomic nucleus in a low-energy state absorbs the high-frequency energy and thus is excited to a high-energy state. The atomic nucleus has different resonance frequencies according to its type, and resonance is affected by the strength of the external magnetic field. In the human body, numerous atomic nuclei exist and generally, a hydrogen atomic nucleus is used to capture an MR image of a patient.

An MRI system is non-invasive, has superior tissue contrast as compared to a computed tomography (CT), and generates no artifact due to a bone tissue. Moreover, the MRI system may capture various cross-sections in a desired direction without changing a position of an object, and thus has been widely used together with other image diagnostic apparatuses.

A diagnostic method based on MRI has various advantages, but when an MRI is performed, for example, to image a brain, a motion artifact generated by movement of an object may cause degradation of the quality of the MR image.

One approach to avoid the motion artifact is to eliminate an object motion. However, it is difficult to remove a cause for every motion artifact, as for example, breathing of a patient. When a high resolution image is required, such as for example, when imaging a brain, the motion artifact has a great influence upon the quality of the image, and statically, 40% of the MR images of the brain have motion artifacts, and 10% out of them need a rescan due to the motion artifacts.

Another approach is obtaining a large amount of effective captured data to improve a signal-to-noise ratio (SNR), or shortening a scan time. However, these two factors have a trade-off relationship, and therefore, a compromise for satisfying both of them at the same time is required. The scan time is directly proportional to the number of repetition times (TR), each of which refers to one period from a 90° pulse to the next 90° pulse in a pulse sequence, and its own length of TR.

SUMMARY

Exemplary embodiments may address at least the above problems and/or disadvantages and other disadvantages not described above. Also, the exemplary embodiments are not required to overcome the disadvantages described above, and an exemplary embodiment may not overcome any of the problems described above.

One or more of exemplary embodiments provide a method and apparatus for capturing an MR image, by which a scan time is shortened and an MR signal, which is robust against a motion artifact, is obtained.

One or more of exemplary embodiments also provide a computer-readable recording medium having recorded thereon a program for executing the method of capturing an MR image on a computer.

According to an aspect of an exemplary embodiment, there is provided a method of capturing a magnetic resonance image including applying a radio frequency (RF) pulse sequence, obtaining an MR signal in response to the applied RF pulse sequence, and generating an MR image from the obtained MR signal, in which the applied pulse sequence includes at least one spiral pulse sequence having a spiral trajectory on a k-space and at least one blade on the k-space.

According to an aspect of another exemplary embodiment, there is provided an apparatus for capturing a magnetic resonance image including a radio frequency (RF) transmitter for generating an RF pulse sequence used to obtain an MR signal, a data processor for obtaining the MR signal in response to an applied RF pulse sequence, and an image processor for generating an MR image by processing the obtained MR signal, in which the applied pulse sequence includes at least one spiral pulse sequence having a spiral trajectory on a k-space and at least one blade on the k-space.

The at least one spiral pulse sequences may exist on a two-dimensional (2D) k-space and the trajectories of the at least one spiral pulse sequences may include a center of the 2D k-space.

The at least one blade may exist on the 2D k-space, and the trajectories of the at least one blade may intersect another pulse sequence at the center of the 2D k-space.

The applied pulse sequence may include two blades, and trajectories of the two blades may be orthogonal to each other.

The applied pulse sequence may include a plurality of spiral pulse sequences which exist on a three-dimensional (3D) k-space.

Respective trajectories of the plurality of spiral pulse sequences may be perpendicular to one axis of the 3D k-space and may be parallel with each other.

Respective trajectories of the plurality of spiral pulse sequences may intersect each other with respect to one axis of the 3D k-space.

The at least one blade may exist on the 3D k-space, and the trajectories of the at least one blade may intersect each of the plurality of spiral pulse sequences at spiral centers.

The at least one blade may be generated according to at least one of an echo planar imaging (EPI) method, a fast spin echo (FSE) method, and a parallel imaging (PI) method.

The at least one blade may not have an equal interval.

According to an aspect of another exemplary embodiment, there is provided a computer-readable recording medium having recorded thereon a program for executing the method of capturing an MR image on a computer.

BRIEF DESCRIPTION OF THE DRAWINGS

The above and/or other aspects will become more apparent by describing certain exemplary embodiments, with reference to the accompanying drawings, in which.

DETAILED DESCRIPTION

Figure 1:
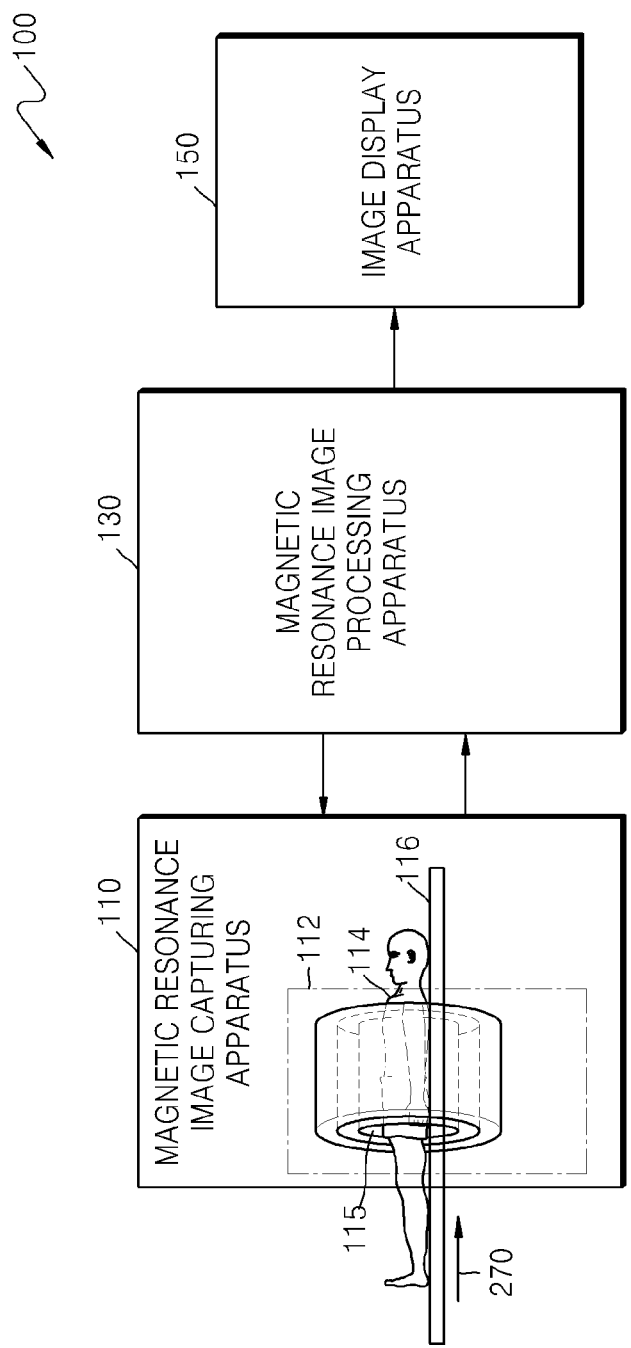
FIG. 1 is a diagram of an MRI system.

Certain exemplary embodiments are described in greater detail below with reference to the accompanying drawings.

In the following description, the same drawing reference numerals are used for the same elements even in different drawings. The matters defined in the description, such as detailed construction and elements, are provided to assist in a comprehensive understanding of exemplary embodiments. Thus, it is apparent that exemplary embodiments can be carried out without those specifically defined matters. Also, well-known functions or constructions are not described in detail since they would obscure exemplary embodiments with unnecessary detail.

The inventive concept is not limited to the exemplary embodiments described below and may be implemented in different forms.

Exemplary embodiments may be implemented by software or hardware components such as a field-programmable gate array (FPGA) or an application-specific integrated circuit (ASIC). The hardware component may include a storage medium capable of addressing, or may be configured to be executed by one or more processors. Software component may include object-oriented software components, class components, and task components, and processes, functions, attributes, procedures, subroutines, segments of a program code, drivers, firmware, a micro code, a circuit, data, a database, data structures, tables, arrays, and variables. Functions provided by different components may be combined into a smaller number of components or may be further separated into additional components.

FIG. 1 is a block diagram schematically illustrating the overall structure of an MRI system 100 according to an exemplary embodiment. The MRI system 100 may include a magnetic resonance image capturing apparatus 110, a magnetic resonance image processing apparatus 130, and an image display apparatus 150. The respective apparatuses of the MRI system 100 may be integrated rather than physically separated as shown in FIG. 1.

The magnetic resonance image capturing apparatus 110 receives input of a control signal for capturing an MR image, operates using the control signal, and obtains an MR signal used to generate an MR image from an object 114 positioned in a magnet system 112 for output to the magnetic resonance image processing apparatus 130. The object 114 is moved to a bore 115 of the magnet system 112 on a cradle 116.

The magnetic resonance image processing apparatus 130 receives the MR signal from the magnetic resonance image capturing apparatus 110, reconstructs the MR signal to generate the MR image of the object 114, and forwards the generated MR image to the image display apparatus 150. The magnetic resonance image processing apparatus 130 may include a user interface for receiving control information from a user, an image processor for reconstructing the MR signal to generate the MR image, a storage for storing the generated MR image and various information, and an input/output unit for connection with the magnetic resonance image capturing apparatus 110 and the image display apparatus 150.

The image display apparatus 150 receives the MR image generated by the magnetic resonance image processing apparatus 130 and displays the MR image on a display unit.

Figure 2:
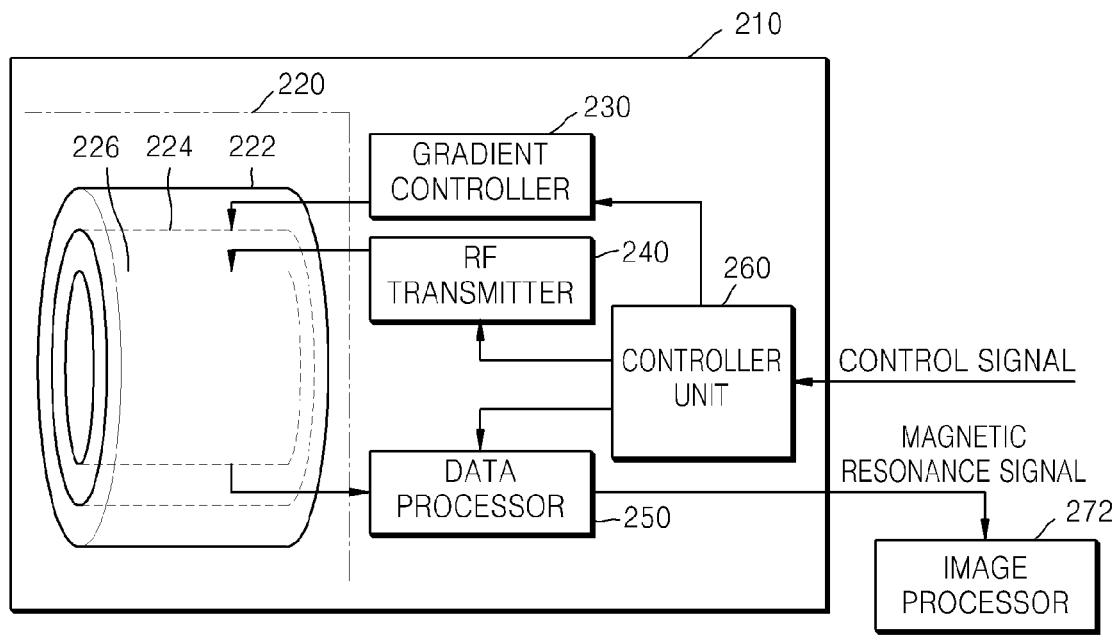
FIG. 2 is a diagram illustrating an apparatus for capturing an MR signal in an MRI system.

FIG. 2 is a block diagram illustrating an MR image capturing apparatus 210 for obtaining an MR signal in an MRI system 100 according to an exemplary embodiment. The MR image capturing apparatus 210 may include a magnet system 220, a gradient controller 230, a radio frequency (RF) transmitter 240, a data processor 250, and a controller 260. The magnet system 220 may include a main magnet 222, a gradient coil assembly 224, and an RF coil assembly 226. The MR image capturing apparatus 210 may further include an amplifier for amplifying a signal and a low-pass filter (LPF) for noise processing.

According to an exemplary embodiment, the main magnet 222, the gradient coil assembly 224, and the RF coil assembly 226 may have cylindrical shapes and may be arranged along the same central axis. As shown in FIG. 2, the main magnet 222, the gradient coil assembly 224, and the RF coil assembly 226 are sequentially arranged in that order from outermost side to the bore 115. The object 114 is located on the cradle 116 which is moved to the bore 115 of the magnet system 220, such that a magnetic field and a high frequency may be applied to the object 114.

The main magnet 222 generates a static magnetic field $B_0$ in the bore 115 of the magnet system 220. A direction of the static magnetic field $B_0$ may be parallel or perpendicular to a body axis 270 of the object 114, i.e., to a longitudinal direction of the object 114. In the following description, the static magnetic field $B_0$ is assumed to be a horizontal magnetic field which is parallel to the body axis 270 of the object 114.

A hydrogen atomic nucleus has a magnetic moment, which may also be referred to as a magnetic dipole moment, due to spinning movement. When an external magnetic field does not exist, the direction of the magnetic moment is random. When a hydrogen atom is situated in a static magnetic field, atomic nuclei become aligned in a static magnetic field direction to assume a low-energy state. For example, when a static magnetic field $B_0$ is applied to hydrogen atoms, a magnetic moment is arranged in a direction of the static magnetic field $B_0$.

Due to spinning movement of the hydrogen atomic nuclei, the magnetic moment is inclined by $\alpha$, and nuclei perform precession about the direction of the static magnetic field. Precession speed of atomic nuclei is determined by a precession frequency, i.e., Larmor frequency F, which is a product of a gyromagnetic ratio $\gamma$ and a strength $B_0$ of an externally applied magnetic field:

$$F = \gamma B_0 \qquad (1)$$

where the gyromagnetic ratio $\gamma$ may be a unique proportional constant having a value which differs according to an atomic nucleus.

A hydrogen atomic nucleus has a Larmor frequency of 42.58 Hz in a magnetic field of 1.0 T. If an electromagnetic wave corresponding to such a Larmor frequency is applied to an atomic nucleus, the atomic nucleus in a low-energy state transits to a high-energy state.

A main magnet which serves to generate a static magnetic field may be, for example, a permanent magnet, a room-temperature electromagnet, or a superconducting electromagnet.

The gradient coil assembly 224 forms magnetic field gradients along three axes which are perpendicular to each other, such as coordinate axes x, y, and z. One of the three axes may be a slice axis, another one may be a frequency axis, and the other one may be a phase axis.

The slice axis may be set to have a direction which is inclined by a particular angle with respect to the body axis 270. For example, z axis may be the slice axis, x axis may be the frequency axis, and y axis may be the phase axis. Thus, the z axis is an axis extending along the body axis 270.

When the static magnetic field $B_0$ is generated inside the bore 115, signals of tissues having similar characteristics are emitted at a time, making it difficult to identify which signal is emitted from which position. To solve this problem, a magnetic field gradient is generated. By using a magnetic field gradient in which the distribution of the magnetic field and a corresponding Larmor frequency linearly change space by space, a hydrogen atomic nucleus at a particular position of the object, which corresponds to a region of interest (ROI), may be selectively resonated.

For example, a static magnetic field having a strength of 1.3 T through 1.7 T may be formed in the bore. The magnetic field gradient may be formed in the direction of the body axis 270 of the object using the gradient coil assembly 224, to obtain an MR image of a cross-section which is perpendicular to the body axis, and a high frequency of the Larmor frequency corresponding to 1.5 T is applied to selectively resonate hydrogen atomic nuclei of that particular cross-section. Hydrogen atomic nuclei on a cross-section at another position do not generate resonance because of having a different Larmor frequency.

The gradient coil assembly 224 may form three magnetic field gradients in the directions of x, y, and z axes of the object. To selectively excite a particular cross-section which is perpendicular to the body axis of the object, a magnetic field gradient is formed along the body axis of the object, and in this case, a slice selection gradient is applied. To obtain a 2D space information on the selected plane, a frequency encoded gradient and a phase encoded gradient are applied. As such, to form magnetic field gradients along the slice axis, the frequency axis, and the phase axis, the gradient coil assembly 224 has three types of gradient coils.

The RF coil assembly 226 applies an RF pulse for exciting hydrogen atomic nuclei in the object and obtains electromagnetic waves generated when the excited hydrogen atomic nuclei return to a stable state, i.e., an MR signal. The RF coil assembly 226 according to an exemplary embodiment may apply RF pulses of various types to the object, and may apply a pulse sequence including a plurality of RF pulses to the object.

The gradient controller 230 is connected with the gradient coil assembly 224, and outputs a signal to form the magnetic field gradient. The gradient controller 230 includes driving circuits corresponding to three types of gradient coils for the slice axis, the frequency axis, and the phase axis. The RF transmitter 240 is connected with the RF coil assembly 226, and outputs an RF pulse and a signal related to application of the RF pulse to the RF coil assembly 226.

The data processor 250 is connected with the RF coil assembly 226, receives the MR signal from the RF coil assembly 226, and processes the received MR signal into digital data. The data processor 250 may include an amplifier for amplifying the received MR signal, a demodulator for demodulating the amplitude of the MR signal, an analog-to-digital converter (ADC) for converting the demodulated analog signal into a digital format, and a storage for storing the MR signal converted into the digital format. The MR signal converted into the digital format is forwarded to the magnetic resonance image processing apparatus 130, to generate an MR image, for example, by an image processor 272.

The controller 260 controls the gradient controller 230, the RF transmitter 240, and the data processor 250 to obtain an MR signal. The controller 260 receives input of a control signal transmitted from the MR image processing apparatus to control the MR image capturing apparatus 210.

The controller 260 may further include a memory which may store a program for an operation of the controller 260, an RF pulse, and various data related to application of a pulse sequence. For example, the memory may store information about a magnetic field gradient formed by the gradient coil assembly 224, a frequency value of an RF pulse based on a strength of a magnetic field, a duration time of an RF pulse related to a rotation angle of a magnetic moment of a hydrogen atomic nucleus, or information about the intensity of the RF pulse which is related to how fast the magnetic moment of the hydrogen atomic nucleus rotates. The memory may also store tissue-based information for the time consumed to restore a state prior to application of the RF pulse from rotation of the magnetic moment of the hydrogen atomic nucleus due to the applied RF pulse, that is, the direction of the previously formed static magnetic field.

Figure 3:
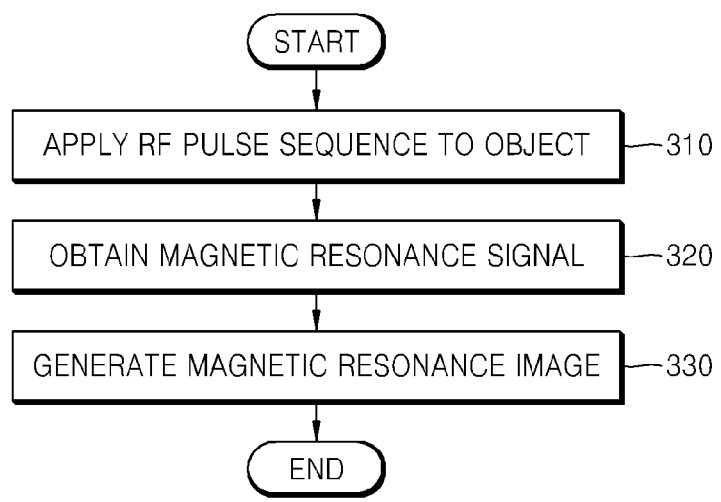
FIG. 3 is a flowchart illustrating a method of capturing an MR image according to an exemplary embodiment.

FIG. 3 is a flowchart illustrating a method of capturing an MR image according to an exemplary embodiment. An object, which is positioned on a cradle, is moved to a bore of the magnet system 220. The entire object may be imaged or a specific portion of the object, for example, brain, may be imaged. When a driving signal is input to the RF transmitter 240 from the controller 260, the RF coil assembly 226 receives input of an RF pulse sequence from the RF transmitter 240 and applies an RF pulse sequence to the object, in step 310.

The data processor 250 obtains an MR signal in response to the applied RF pulse sequence, in step 320. For example, a spin echo (SE) method may be used to obtain the MR signal. In an SE method, atomic nuclei start being de-phased from an instant when application of a 90° RF pulse is stopped, and in this state, a free induction decaying (FID) signal is emitted. Thereafter, various echo signals are obtained by using an RF coil according to the application of a 180° RF pulse. Also, a pulse sequence may be generated by an FSE method, an inversion recovery (IR) method, a gradient echo (GE) method, a field echo (FE) method, an EPI method, a PI method, and the like.

In step 330, the magnetic resonance image processing apparatus 130 generates an MR image by performing post-processing of the MR signal obtained in step 320. The generated image is displayed on the image display apparatus 150.

A k-space is a data space of each cross-section, and by performing Fourier transform on the k-space, a desired image may be obtained. If sizes of a phase encoded gradient and a frequency encoded gradient are changed step-by-step after the RF pulse sequence is applied, then raw data having various location information may be obtained. The raw data has location information and tissue contrast information together, and the k-space refers to a group of raw data which may form one image. The collected signal is stored in the k-space, and during each TR, each slice identifies the location information based on the phase encoded gradient and the frequency encoded gradient.

When the MR image is a 2D image, it has a 2D k-space; if the MR image is a 3D image, it has a 3D k-space. Each axis of the k-space corresponds to a spatial frequency. A frequency component becomes a low-frequency component toward the center of the k-space, so that the data corresponding to the central region of a 3D k-space or a 2D k-space has an effective meaning as an MR signal. Therefore, if the central region of the k-space is denser, more effective data may be over-sampled and thus a high-quality MR image may be obtained.

However, due to a trade-off relationship between obtaining more data and a scan time as described above, if the central region of the k-space becomes excessively dense, the scan time increases, which may worsen effects due to the object motion, i.e., in the case of a child.

To obtain a high-resolution MR image or an MR image specified for a disease, a diffusion MRI method, a perfusion MRI method, or a functional MRI method may be used.

The diffusion MRI method uses signal strength based on a diffusion degree of a tissue by additionally using a pair of diffusion magnetic field gradients in addition to a general magnetic field gradient to maximize weak signal reduction caused by diffusion. Thus, the diffusion MRI method images microscopic movement caused by diffusion of water molecules in the tissue as a difference in diffusion coefficients, rather than using a direct blood vessel or blood stream inspection. The diffusion MRI method may include two types: a diffusion weighted image (DWI) and a diffusion tensor image (DTI). The DWI allows observation of movement of micro water molecules, and the DTI allows analysis of nerve fibers connecting two different tissues and movement of water molecules. A main application field of the diffusion MRI method is acute ischemic stroke (AIS), and the diffusion MRI method plays an important role, especially, in acute stroke.

The perfusion MRI method is an MRI technique which uses information about a blood volume per time of capillary flow, which is a blood stream flowing through a capillary to supply oxygen and nutrients to neighboring tissues. For this method, a first-pass method using paramagnetic contrast media is mainly used, and the first-pass method is easy to carry out and has a short scan time, but needs complex post-processing and is prone to an error. A main application field of the perfusion MRI method is acute ischemic stroke (AIS) and brain tumors, and the perfusion MRI method is mainly used to evaluate vascularity of tumors.

The functional MRI method uses a physiological phenomenon in which if a brain neural activity of a particular brain portion is accelerated, then brain blood stream and metabolism of that brain portion are locally increased, based on a fact that the brain performs a particular function for each brain portion. When compared to positron emission tomography (PET), the functional MRI method has superior space and time resolutions, and does not need injection of a radioactive isotope and thus may be repetitively carried out. The functional MRI method has evolved to a stage of imaging a cognitive function including a language function from primary visual cortex and motor cortex images. Research is now being conducted on sensorimotor functions or influences of medicines upon brain functions.

Figure 4:
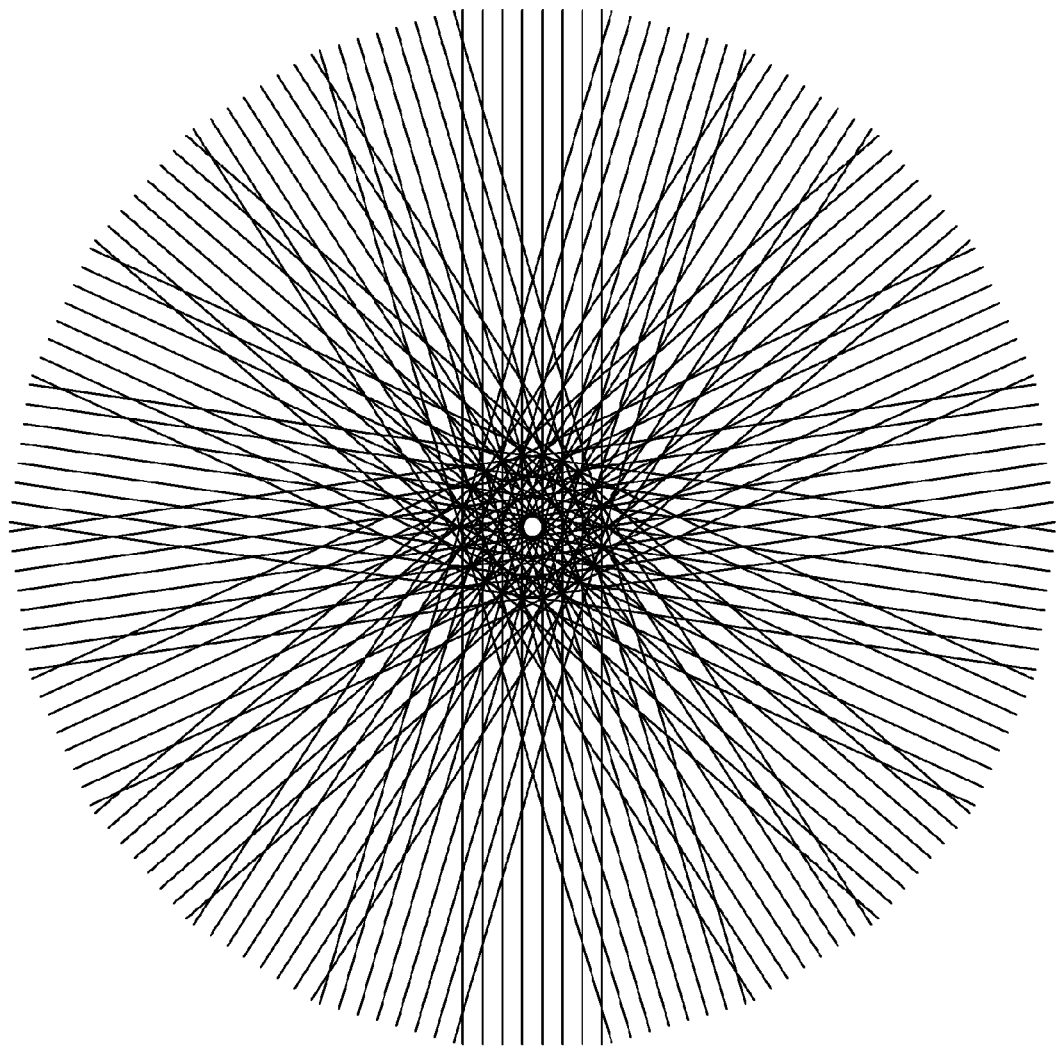
FIG. 4 is a diagram illustrating a blade trajectory of a 2D k-space using a periodically rotated overlapping parallel lines with enhanced reconstruction (PROPELLER) technique.

FIG. 4 is a diagram illustrating a blade or a strip trajectory of a 2D k-space using a PROPELLER technique. The blade has a linear trajectory in which Cartesian pulse sequences corresponding to phase encoded lines are arranged in parallel with each other, having a predetermined length. The quality of an MR image may vary with the number of phase encoded lines which form the blade and an interval between the phase encoded lines which form the blade.

The PROPELLER technique fills the 2D k-space while rotating the blade about the origin at an angle. Since the central portion of the k-space is over-sampled, robustness against a structural motion artifact may be achieved and motion artifacts may be reduced or substantially eliminated, such that a better quality MR image may be obtained. However, according to the PROPELLER technique, when compared to other methods using Cartesian pulses, the amount of k-space data is two or three times greater and, correspondingly, a scan time is increased. As shown in FIG. 4, eleven TRs are applied, and an increase in TRs causes an increase in a scan time. The TR for obtaining a complete MR image may vary with the number of phase encoded lines of the blade and an interval between the phase encoded lines. An increase in a scan time may become greater in 3D MR imaging.

Figure 5:
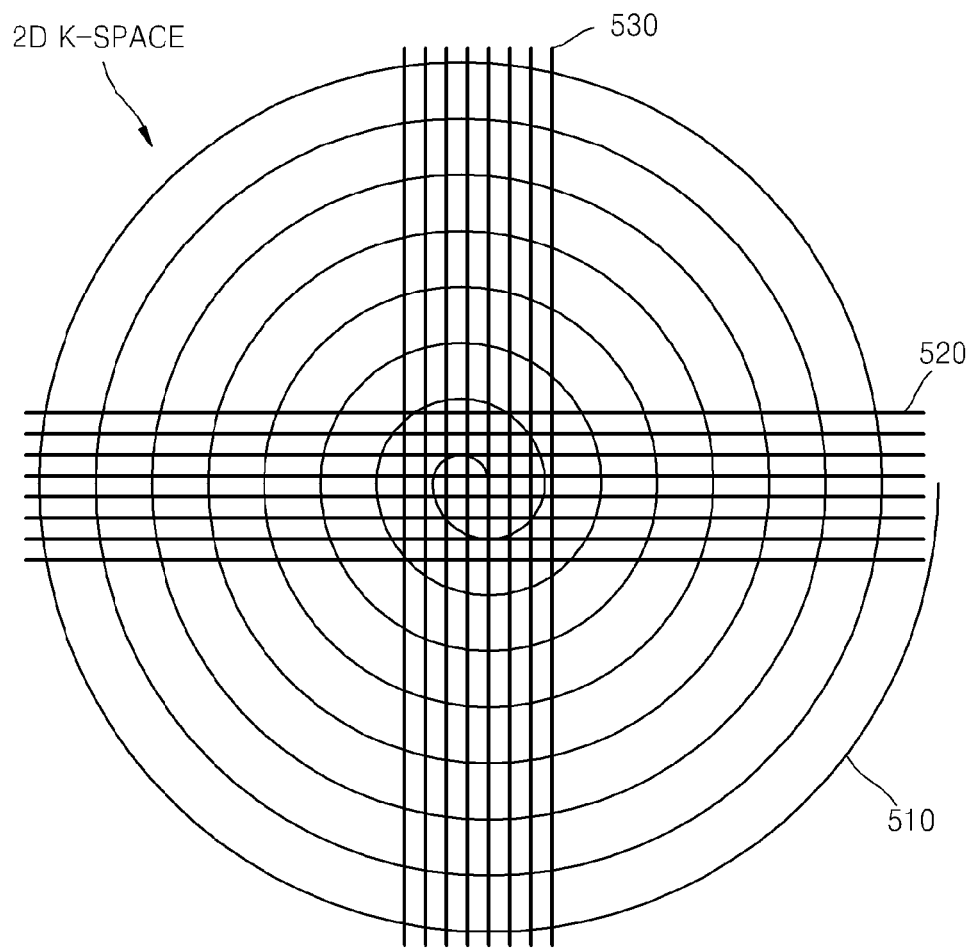
FIG. 5 is a diagram illustrating a pulse trajectory of a 2D k-space according to an exemplary embodiment.

FIG. 5 is a diagram illustrating a pulse trajectory of a 2D k-space according to an exemplary embodiment. In FIG. 5, there exists one spiral pulse sequence 510 having one spiral trajectory in a 2D k-space and two blades 520 and 530 in the k-space.

In an exemplary embodiment shown in FIG. 5, the blades 520 and 530 are orthogonal to each other at the center of the spiral pulse sequence 510, such that the 2D k-space center may obtain a denser data sample than the other regions and thus an MR signal which is robust against a motion artifact may be obtained. In an exemplary embodiment of FIG. 5, the RF sequence is applied only three times, and only three TRs are needed, reducing a scan time and reducing an influence of a motion artifact in an MR image, and thereby reducing a negative influence of a specific absorption rate (SAR) upon a human body. As mentioned previously, the scan time is proportional to the number TRs and a TR repetition period.

As shown, the blades 520, 530 are orthogonal to each other, but an intersecting angle between the blades may vary. Also, an exemplary embodiment may include three or more blades and/or two or more spiral pulse sequences.

Figure 6:
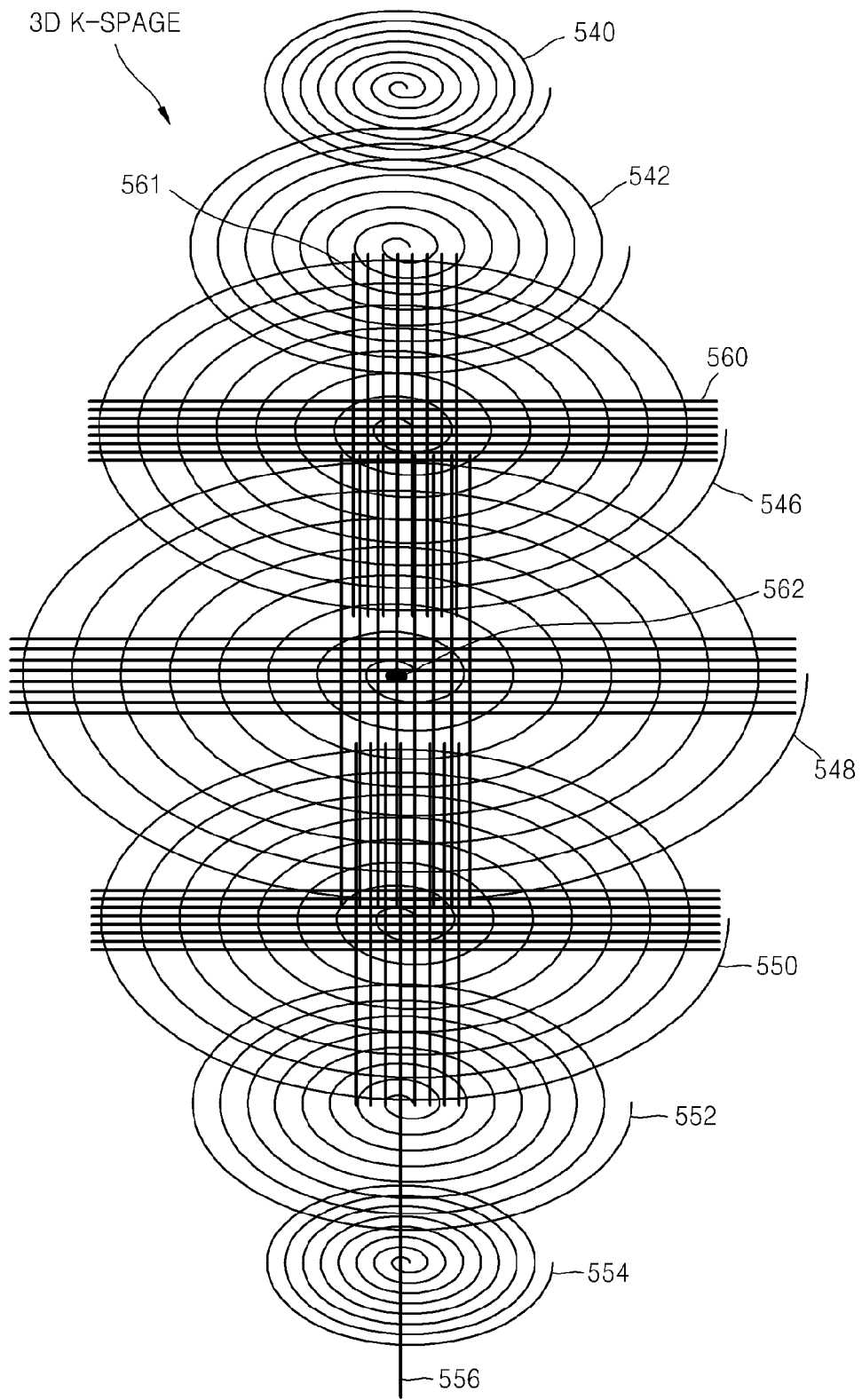
FIG. 6 is a diagram illustrating a pulse trajectory of a 3D k-space according to an exemplary embodiment.

FIG. 6 is a diagram illustrating a pulse trajectory of a 3D k-space according to an exemplary embodiment. In an exemplary embodiment shown in FIG. 6, the pulse trajectory of the 3D k-space is structured such that pulse trajectories 540, 542, 546, 548, 550, 552, and 554 are perpendicular to an axis 556 of the 3D k-space and stacked in parallel with each other. To reduce the number of TRs and the scan time, blades 560, 561 may intersect each other on the spiral pulse trajectories 546, 548, and 550 located near the center 562 of the 3D k-space, i.e., in a central region of the k-space. The blades may only partially intersect the spiral trajectories 542, 552 which are located further from the center 562 of the 3D k-space and may be omitted on the spiral pulse trajectories 540, 554 which are located furthest from the center 562 of the 3D k-space.

Figure 7A:
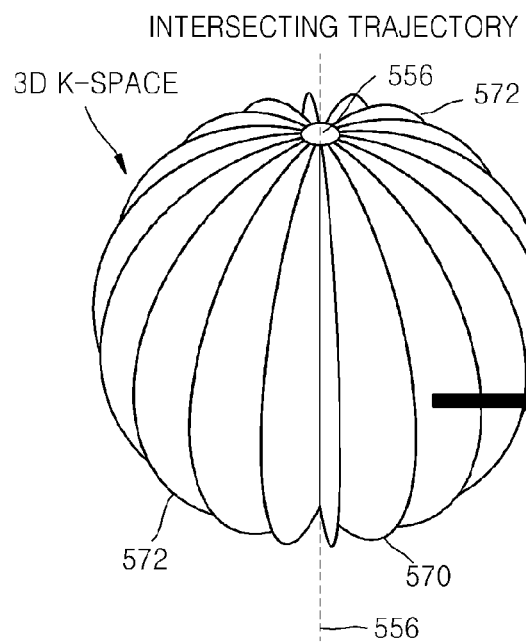
FIGS. 7A and 7B illustrate a pulse trajectory of a 3D k-space according to another exemplary embodiment.
Figure 7B:
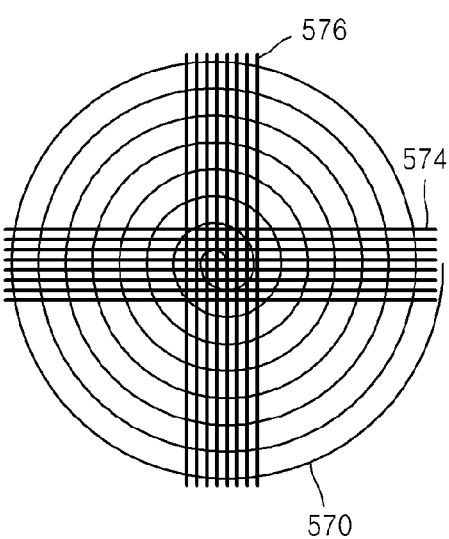

FIG. 7A is a diagram illustrating a pulse trajectory of a 3D k-space according to another exemplary embodiment. In an exemplary embodiment of FIG. 7A, the pulse trajectory of the 3D k-space is structured such that the pulse trajectories 570, 572, etc., intersect one another along an axis 556 of the 3D k-space so that an angle is formed between the planes of the adjacent pulse trajectories. In a 2D k-space shown in FIG. 7B, two blades 574, 576 intersect each other and the pulse trajectory 570, as an example.

In the exemplary embodiments shown in FIGS. 6 and 7, an intersecting angle between blades may vary, and three or more blades may be included for each spiral pulse sequence or different numbers of blades may be included. Also, not all of the pulse trajectories shown in FIG. 7A may be intersected by the blades.

FIGS. 8A, 8B, 8C, and 8D are diagrams illustrating generation of a blade and a trajectory according to another exemplary embodiment. An FSE method of FIG. 8C applies a 90° RF pulse to obtain a plurality of echoes, and applies a 180° RF pulse several times after reception of an FID signal. In this case, a different phase encoded gradient is applied each time before each echo is obtained, and after the echo is obtained, the phase encoded gradient is applied to the opposite side, thereby obtaining several frequency converted data in one TR. The FSE method may perform scanning within a shorter time than an SE method, and thus the FSE method may efficiently obtain data while reducing an artifact.

Figure 8A:
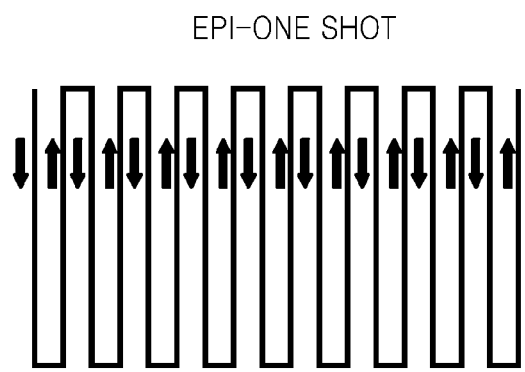
FIGS. 8A, 8B, 8C, and 8D illustrate generation of a blade and a trajectory according to another exemplary embodiment.
Figure 8B:
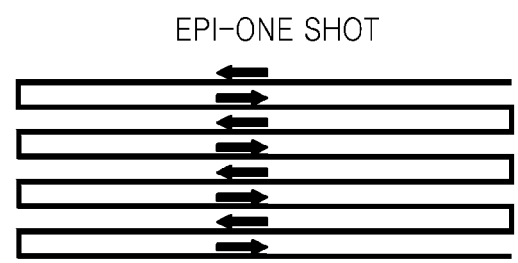
Figure 8C:
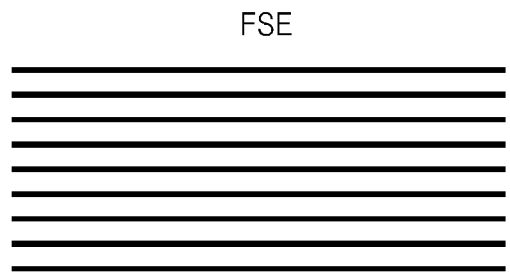

An EPI method of FIGS. 8A and 8B is an ultrahigh-speed image capturing method capable of obtaining data by exciting a spin with one RF pulse through high-speed vibration of a magnetic field gradient. The EPI method is one of the fastest functional MRI methods, and is used to scan brain activities related to a change in a blood stream.

Figure 8D:
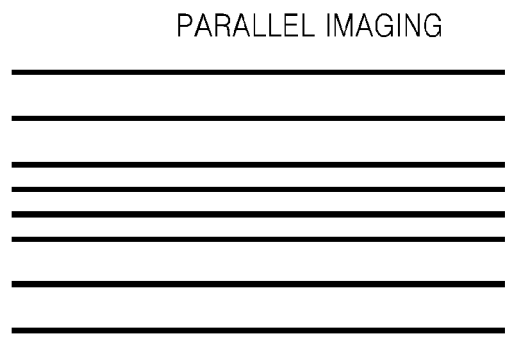

A PI method of FIG. 8D is an MRI method which reduces a scan time by reducing the number of times of magnetic field gradient encoding using a difference between sensitivities of different RF coils. More specifically, the PI method is implemented by recording an image while under-sampling a k-space at a plurality of RF coils. Through the under-sampling, a scan time may be reduced, and through the use of the plurality of RF coils, imaging of a region out of an FOV, which may be caused by under-sampling, that is, an aliasing artifact may be reduced.

Figure 9:
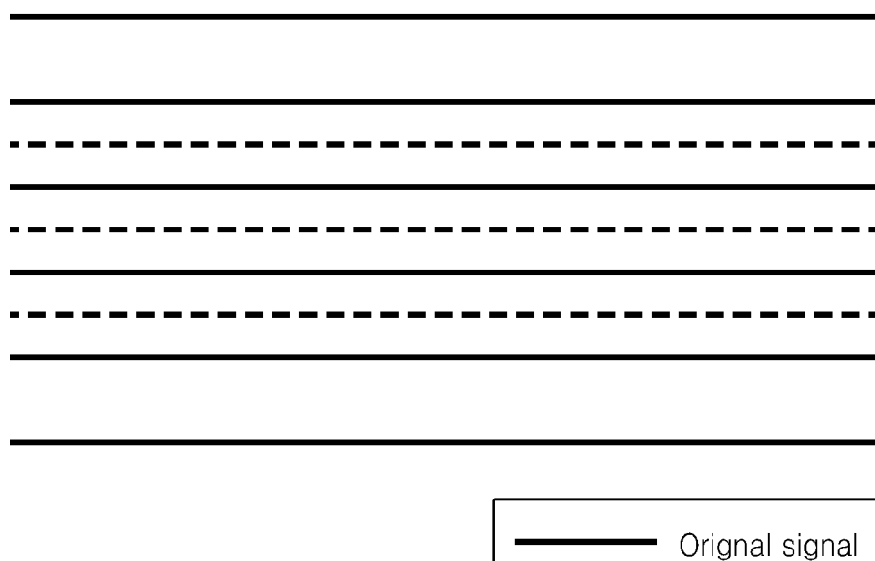
FIG. 9 is a diagram illustrating a trajectory of a blade to which an auto calibration signal (ACS) line is added.

FIG. 9 is a diagram illustrating a trajectory of a blade to which an ACS line is added. The PI method uses an RF coil array, and an auto-calibrating technique may be applied such that k-space data may be added by a linear combination of measured data. By adding an ACS line to the central portion of a blade using the auto-calibrating technique, a denser data sample may be obtained at the central portion of the k-space. Therefore, in practice, similar data quality may be obtained with a smaller number of lines.

As is apparent from the foregoing description, when an RF pulse sequence for obtaining an MR signal is applied, a spiral pulse sequence and a blade pulse sequence which pass the center of the k-space are applied, thereby reducing a scan time and generating an MR image which is robust against a motion artifact.

Terms used in the specification and claims should not be limited to common or lexical meanings and should be construed as meanings and concepts suitable for the technical spirit of the present invention based on a principle that the inventor can define the concept of a term in order to describe his/her invention in the best way.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A method of capturing a magnetic resonance (MR) image, the method comprising:
    applying a radio frequency (RF) pulse sequence;
    obtaining an MR signal in response to the applied RF pulse sequence; and
    generating an MR image from the obtained MR signal,
    wherein the applied RF pulse sequence comprises a spiral pulse sequence having a spiral trajectory centered on a k-space and a first blade and a second blade intersecting one another and a spiral trajectory on the k-space, and each of the first blade and the second blade comprises at least one parallel trajectory.

2. The method of claim 1, wherein the spiral trajectory of the spiral pulse sequence spirals around a center of a two-dimensional (2D) k-space.

3. The method of claim 2, wherein a trajectory of the first blade intersects a trajectory of the second blade near the center of the 2D k-space.

4. The method of claim 3, wherein the trajectories of the first blade and the second blade are orthogonal to each other.

5. The method of claim 1, wherein the applied RF pulse sequence comprises a plurality of spiral pulse sequences in a three-dimensional (3D) k-space.

6. The method of claim 5, wherein respective trajectories of the plurality of spiral pulse sequences are perpendicular to one axis of the 3D k-space and are parallel with each other.

7. The method of claim 5, wherein respective trajectories of the plurality of spiral pulse sequences intersect each other at one axis of the 3D k-space.

8. The method of claim 5, wherein a trajectory of the first blade intersects with each of the plurality of spiral pulse sequences at spiral centers, in the 3D k-space.

9. The method of claim 1, wherein the first blade is generated according to at least one of an echo planar imaging (EPI) method, a fast spin echo (FSE) method, and a parallel imaging (PI) method.

10. The method of claim 1, wherein gaps between lines of the first blade are different from one another.

11. A non-transitory computer-readable recording medium having recorded thereon a program for executing the method of claim 1 by a computer.

12. The method of claim 1, wherein the spiral trajectory comprises a single spiral which spirals through 360 degrees of a two-dimensional (2D) k-space.

13. An apparatus for capturing a magnetic resonance (MR) image, the apparatus comprising:
    a radio frequency (RF) transmitter which transmits an RF pulse sequence;
    a data processor which obtains the MR signal in response to an applied RF pulse sequence; and
    an image processor which generates an MR image by processing the obtained MR signal,
    wherein the applied RF pulse sequence comprises a spiral pulse sequence having a spiral trajectory centered on a k-space and a first blade and a second blade intersecting one another and a spiral trajectory on the k-space, and each of the first blade and the second blade comprises at least one parallel trajectory.

14. The apparatus of claim 13, wherein the spiral trajectory of the spiral pulse sequence spirals around a center of a two-dimensional (2D) k-space.

15. The apparatus of claim 14, wherein a trajectory of the first blade intersects a trajectory of the second blade near the center of the 2D k-space.

16. The apparatus of claim 15, wherein the trajectories of the first blade and the second blade are orthogonal to each other.

17. The apparatus of claim 13, wherein the applied RF pulse sequence comprises a plurality of spiral pulse sequences in a three-dimensional (3D) k-space.

18. The apparatus of claim 17, wherein respective trajectories of the plurality of spiral pulse sequences are perpendicular to one axis of the 3D k-space and are parallel with each other.

19. The apparatus of claim 17, wherein respective trajectories of the plurality of spiral pulse sequences intersect each other at one axis of the 3D k-space.

20. The apparatus of claim 17, wherein a trajectory of the first blade intersects with each of the plurality of spiral pulse sequences at spiral centers, in the 3D k-space.

21. The apparatus of claim 13, wherein the first blade is generated according to at least one of an echo planar imaging (EPI) method, a fast spin echo (FSE) method, and a parallel imaging (PI) method.

22. The apparatus of claim 13, wherein gaps between lines of the first blade are different from one another.

23. A magnetic resonance imaging (MRI) method comprising:
 generating a radio frequency (RF) pulse sequence comprising a spiral sequence with a spiral trajectory centered on a two-dimensional (2D) k-space and a first blade and a second blade intersecting one another and the spiral trajectory near a center of the 2D k-space;
 collecting MR signals in response to applying the RF pulse sequence into an imaging region in which an object is disposed;
 reconstructing an MR image from the MR signals; and
 displaying the MR image on a display,
 wherein each of the first blade and the second blade comprises at least one parallel trajectory.

24. The method of claim 23, wherein the RF pulse sequence comprises a plurality of spiral pulse sequences in a three-dimensional (3D) k-space,
 a trajectory of each of the plurality of spiral pulse sequences spirals around a same axis of the 3D k-space, and
 a trajectory of the first blade extends in a direction of the same axis of the 3D k-space and intersects the trajectory of some or all of the plurality of spiral pulse sequences near spiral origins.

25. The method of claim 23, wherein the RF pulse sequence comprises a plurality of spiral pulse sequences and a plurality of the first blades, in a three-dimensional (3D) k-space,
 a trajectory of each of the plurality of spiral pulse sequences spirals around a same axis of the 3D k-space, and
 the trajectory of each of the plurality of the first blades extends in a direction perpendicular to the same axis of the 3D k-space and intersects trajectories of some of the plurality of spiral pulse sequences near spiral origins.

26. The method of claim 25, wherein the RF pulse sequence comprises a plurality of second blades in the 3D k-space, and
 a trajectory of each of the plurality of the second blades extends in a direction of the same axis of the 3D k-space and intersects the trajectory of each of the plurality of the first blades near the spiral origins.

27. The method of claim 23, wherein the RF pulse sequence comprises a plurality of spiral pulse sequences and a plurality of the first blades, in a three-dimensional (3D) k-space,
 a trajectory of each of the plurality of spiral pulse sequences intersects a same axis of the 3D k-space, and
 a trajectory of each of the plurality of the first blades extends in a direction perpendicular to the same axis of the 3D k-space and intersects the trajectory of some of the plurality of spiral pulse sequences near spiral origins.

28. The method of claim 27, wherein the RF pulse sequence further comprises a plurality of second blades in the 3D k-space, and
 the trajectory of each of the plurality of the second blades intersects the trajectory of each of the plurality of the first blades near the spiral origins.

* * * * *